(12) United States Patent
Mathe (10) Patent No.: US 8,704,581 B2
(45) Date of Patent: Apr. 22, 2014

(54) SWITCHED CAPACITOR INTEGRATION AND SUMMING CIRCUITS

(75) Inventor: Lennart K-A Mathe, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 977 days.

(21) Appl. No.: 12/105,545

(22) Filed: Apr. 18, 2008

(65) Prior Publication Data

US 2009/0051421 A1 Feb. 26, 2009

Related U.S. Application Data

(60) Provisional application No. 60/913,509, filed on Apr. 23, 2007.

(51) Int. Cl.
*G06F 7/64* (2006.01)
*H03H 19/00* (2006.01)

(52) U.S. Cl.
CPC .................................. *H03H 19/004* (2013.01)
USPC .......................................................... 327/337

(58) Field of Classification Search
USPC ........... 327/91, 93, 94, 95, 96, 336, 337, 339, 327/554; 330/9
See application file for complete search history.

(56) References Cited

U.S. PATENT DOCUMENTS

| | | | |
|---|---|---|---|
| 5,331,222 A | | 7/1994 | Lin et al. |
| 5,341,050 A | * | 8/1994 | Mellissinos et al. .......... 327/355 |
| 5,426,393 A | | 6/1995 | Sevastopoulos et al. |
| 5,634,202 A | * | 5/1997 | Connell et al. ................ 455/110 |
| 5,680,072 A | * | 10/1997 | Vulih et al. .................... 327/554 |
| 6,359,579 B1 | * | 3/2002 | Chiang .......................... 341/155 |
| 6,653,967 B2 | * | 11/2003 | Hamashita ..................... 341/172 |
| 6,667,843 B2 | * | 12/2003 | Norman et al. ................. 360/67 |
| 6,744,392 B2 | | 6/2004 | Melanson |
| 6,873,276 B2 | * | 3/2005 | Yang et al. ..................... 341/143 |
| 6,940,436 B2 | | 9/2005 | Hezar et al. |
| 7,038,532 B1 | * | 5/2006 | Bocko et al. ................... 327/554 |

(Continued)

FOREIGN PATENT DOCUMENTS

| | | |
|---|---|---|
| DE | 3401516 | 7/1985 |
| JP | 2138609 A | 5/1990 |

(Continued)

OTHER PUBLICATIONS

International Search Report, PCT/US08/060996, International Search Authority, European Patent Office, Oct. 24, 2008.

(Continued)

*Primary Examiner* — Sibin Chen
(74) *Attorney, Agent, or Firm* — Kevin T. Cheatham (57) ABSTRACT

A switched capacitor circuit employs a single operational amplifier to implement both an integrator and a summer. One input signal is routed to the input of the operational amplifier through (1) one or more integration branches, and (2) one or more first summing branches. A second input signal is routed to the input of the operational amplifier through one or more second summing branches. Each of the branches includes a capacitor and a number of switches controlled by different clock phases. The switched capacitor circuit may be single-ended or differential. The circuit may be used in an access terminal of a cellular communication system. The access terminal may operate under a code division multiple access (CDMA) communication standard.

14 Claims, 6 Drawing Sheets

(56) References Cited

U.S. PATENT DOCUMENTS

| | | |
|---|---|---|
| 7,098,730 B1 | 8/2006 | Shui |
| 7,167,121 B2 * | 1/2007 | Carreau et al. ............... 341/150 |
| 7,379,002 B1 | 5/2008 | Zhixu et al. |
| 7,626,525 B2 | 12/2009 | Zhou et al. |
| 8,169,351 B2 | 5/2012 | Lee |
| 2005/0088327 A1 | 4/2005 | Yokoyama et al. |
| 2005/0093726 A1 | 5/2005 | Hezar et al. |
| 2009/0066549 A1 | 3/2009 | Thomsen et al. |
| 2009/0115507 A1 * | 5/2009 | Cho ................................ 330/9 |

FOREIGN PATENT DOCUMENTS

| | | |
|---|---|---|
| JP | 8070251 A | 3/1996 |
| JP | 10190468 A | 7/1998 |
| JP | 2000022500 A | 1/2000 |
| JP | 2001358591 A | 12/2001 |
| JP | 2005136450 A | 5/2005 |
| JP | 2007049745 A | 2/2007 |
| KR | 19970007874 | 5/1997 |
| KR | 20060129544 A | 12/2006 |

OTHER PUBLICATIONS

Written Opinion, PCT/US08/060996, International Search Authority, European Patent Office, Oct. 24, 2008.

Nam et al., A Low-Voltage Low-Power Sigma-Delta Modulator for Broadband Analog-toDigital Conversion, IEEE Journal of Solid-State Circuits, Sep. 2005, vol. 40, No. 9, pp. 1855-1864.

Silva J., et al., Wideband low-distortion delta-sigma ADC topology, Electronics Letters, Jun. 7, 2001, vol. 37, No. 12, pp. 737-738.

* cited by examiner

SWITCHED CAPACITOR INTEGRATION AND SUMMING CIRCUITS

CLAIM OF PRIORITY UNDER 35 U.S.C §119

The present Application for Patent claims priority to U.S. Provisional Application No. 60/913,509, entitled "Switched Capacitor Integrator and Summer Implementation with a Single Operational Amplifier," filed Apr. 23, 2007, which is assigned to the assignee hereof and expressly incorporated herein by reference.

BACKGROUND

1. Field

Apparatus and methods described in this document relate to electronic circuit designs. More specifically, the apparatus and methods relate to switched capacitor integration and summing circuits.

2. Background

Some electronic devices include switched capacitor circuits implementing both integration and signal-summing functions. In particular, sigma-delta modulators or converters may use switched capacitor integrators followed by switched capacitor summers. Sigma-delta modulators may be employed, for example, to convert an intermediate frequency (IF) signal to a baseband frequency signal, in order to meet dynamic range requirements for digital signal processing, and to provide improved adaptability and programmability to receiver circuitry. In these and other applications, the advantages of sigma-delta modulators include high dynamic range, which is often needed to distinguish a small desired signal from blockers and interferers. Sigma-delta modulators shape the quantization noise out-of-band, and allow combining decimation filtering with selective digital filtering and IF mixing to attenuate both the quantization noise and neighboring blockers. In addition, the ability to select different sampling rates in the sigma-delta modulator architecture allows a single device to be adapted to different requirements, for example, the requirements imposed by multiple RF standards. Moreover, the use of higher sampling rates and complex digital signal processing allow sigma-delta converters to exhibit relatively low sensitivity to interfering analog signals.

Size, weight, power consumption, speed, and production costs loom large in designing electronic equipment, and especially portable battery-operated electronic equipment such as wireless access terminals. Therefore, there is a need in the art to reduce the power consumption of electronic equipment, including sigma-delta modulators and other devices that include integrators and summers. There is also a need in the art to decrease size and weight of electronic equipment, including sigma-delta modulators and other devices that include integrators and summers. There is a further need in the art to lower the cost of manufacturing electronic equipment, including sigma-delta modulators and other devices that include integrators and summers. There is still another need in the art to increase the operating speed of electronic equipment, including sigma-delta modulators and other devices that include integrators and summers.

SUMMARY

Embodiments disclosed herein may address one or more of the above stated needs by describing various designs that implement summing and integration functions in a single operational amplifier of a switched capacitor circuit. The operational amplifier may be an operational amplifier.

In an embodiment, a switched capacitor circuit includes: (1) a first circuit input configured to receive a first signal; (2) a second circuit input configured to receive a second signal; (3) an operational amplifier (OA) with an OA input and an OA output; (4) an integration capacitor coupled between the OA input and the OA output to provide negative feedback; (5) an integration branch coupled between the first circuit input and the OA input; (6) a first summing branch coupled between the first circuit input and the OA input; and (7) a second summing branch coupled between the second circuit input and the OA input. The integration branch, the first summing branch, and the second summing branch are configured using switched capacitor technique so that the OA output provides an output signal that is a sum of (1) a product of the first signal, (2) a product of the second signal, and (3) a product of an integral of the first signal. The particular configuration of these branches may be as is shown in FIG. 1C.

Figure 3:
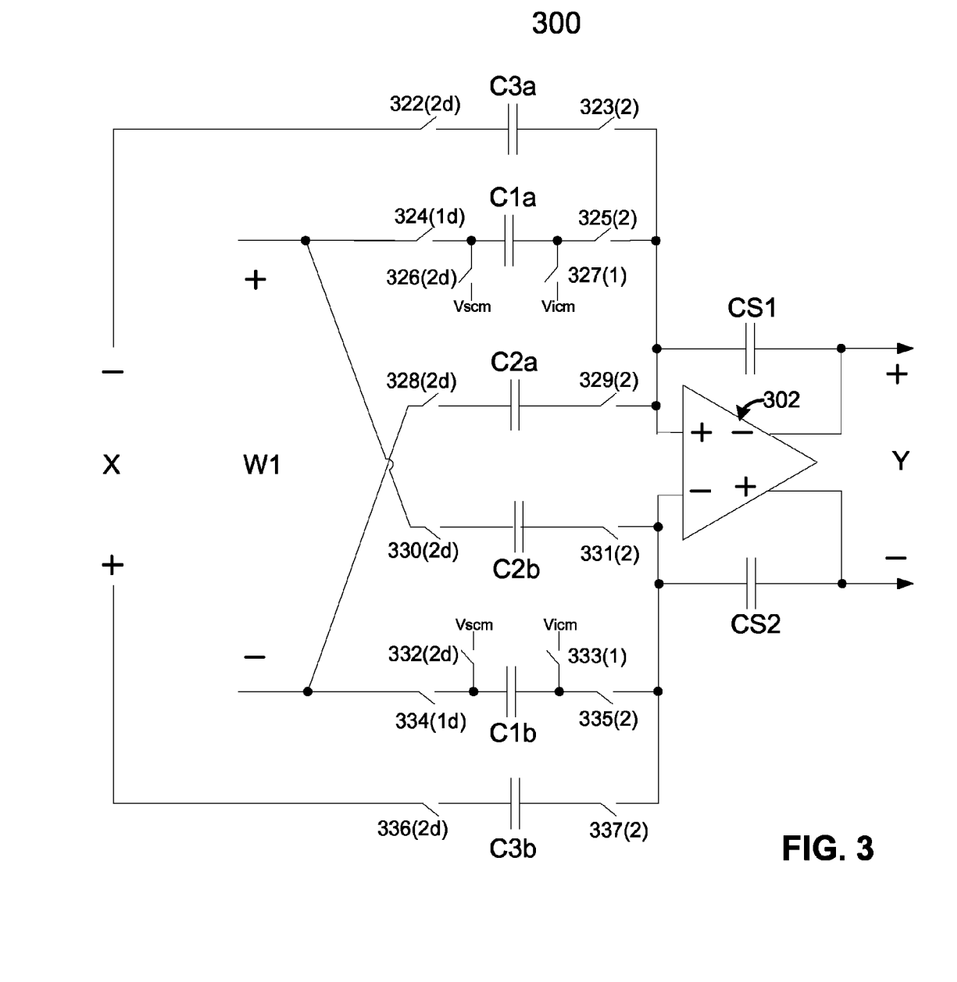
FIG. 3 illustrates selected components of switched capacitor circuit 300 of the current invention of a sigma-delta modulator operating in a differential configuration.

In an embodiment, a switched capacitor circuit includes: (1) a first positive circuit input and a first negative circuit input configured to receive a first signal; (2) a second positive circuit input and a second negative circuit input configured to receive a second signal; (3) an operational amplifier (OA) with a positive OA input, a negative OA input, a positive OA output, and a negative OA output; (4) a first integration capacitor coupled between the positive OA input and the negative OA output; (5) a second integration capacitor coupled between the negative OA input and the positive OA output; (6) a first integration branch coupled between the first positive circuit input and the positive OA input; (7) a second integration branch coupled between the first negative circuit input and the negative OA input; (8) a first summing branch coupled between the first negative circuit input and the positive OA input; (9) a second summing branch coupled between the first positive circuit input and the negative OA input; (10) a third summing branch coupled between the second negative circuit input and the positive OA input; and (11) a fourth summing branch coupled between the second positive circuit input and the negative OA input. The first integration branch, the second integration branch, the first summing branch, the second summing branch, the third summing branch, and the fourth summing branch are configured using switched capacitor technique so that the pair of differential OA outputs provides an output signal that is a sum of (1) a product of the first signal, (2) a product of the second signal, and (3) a product of an integral of the first signal. The particular configuration of these branches may be as is shown in FIG. 3.

In an embodiment, a circuit includes: (1) a first circuit input configured to receive a first signal; (2) a second circuit input configured to receive a second signal; (3) a single operational amplifier (OA) comprising an OA input and an OA output; (4) a switched circuit means for causing the OA output to provide an output signal that is a sum of (1) a product of the first signal, (2) a product of the second signal, and (3) a product of an integral of the first signal.

In an embodiment, a method of processing signals in a switched capacitor circuit includes providing a first input signal to an input of an operational amplifier (OA) through at least one integration branch. The method also includes providing the first input signal to the input of the OA through at least one first summing branch. The method further includes providing a second input signal to the input of the OA through at least one second summing branch. The method further includes providing negative feedback from output of the OA to the input of the OA through at least one feedback capacitor. The method additionally includes providing at least two clock phases to switches of the at least one integration branch, the at least one first summing branch, and the at least one second summing branch, so that the OA outputs a sum of (1) a product of the first signal, (2) a product of the second signal, and (3) a product of an integral of the first signal.

These and other embodiments and aspects of the present invention will be better understood with reference to the following description, drawings, and appended claims.

DETAILED DESCRIPTION

In this document, the words "embodiment," "variant," and similar expressions are used to refer to particular apparatus, process, or article of manufacture, and not necessarily to the same apparatus, process, or article of manufacture. Thus, "one embodiment" (or a similar expression) used in one place or context may refer to a particular apparatus, process, or article of manufacture; the same or a similar expression in a different place may refer to a different apparatus, process, or article of manufacture. The expression "alternative embodiment" and similar phrases may be used to indicate one of a number of different possible embodiments. The number of possible embodiments is not necessarily limited to two or any other quantity.

The word "exemplary" may be used herein to mean "serving as an example, instance, or illustration." Any embodiment or variant described herein as "exemplary" is not necessarily to be construed as preferred or advantageous over other embodiments or variants. All of the embodiments and variants described in this description are exemplary embodiments and variants provided to enable persons skilled in the art to make and use the invention, and not necessarily to limit the scope of legal protection afforded the invention.

An "operational transconductance amplifier" or "OTA" is an amplifier, buffer, or a similar arrangement of individual components in which an input voltage produces an output current; essentially, it is a voltage-controlled current source designed to provide substantially current-source (high impedance) output or outputs. Note that in all embodiments described in this document, an operational amplifier ("OA") may be substituted for an operational transconductance amplifier. The concept of "operational amplifier," as used throughout this document, includes within it the concept of "operational transconductance amplifier."

An access terminal, which also may be referred to as AT, subscriber station, user equipment, UE, mobile terminal, MT, or cellular communication device may be mobile or stationary, and may communicate with one or more base transceiver stations. An access terminal may be any of a number of types of devices, including but not limited to personal computer (PC) card, external or internal modem, wireless telephone, and personal digital assistant (PDA) with wireless communication capability. An access terminal transmits and receives data packets to or from a radio network controller through one or more base transceiver stations.

Base transceiver stations and base station controllers are parts of a network called radio network, RN, access network, or AN. A radio network may be a UTRAN or UMTS Terrestrial Radio Access Network. The radio network may transport data packets between multiple access terminals. The radio network may be further connected to additional networks outside the radio network, such as a corporate intranet, the Internet, a conventional public switched telephone network (PSTN), or another radio network, and may transport data and voice packets between each access terminal and such outside networks. Depending on conventions and on the specific implementations, a base transceiver station of a radio network may be referred to by other names, including Node B, evolved Node B (eNode B), base station system (BSS), BTS, and simply base station. Similarly, a base station controller may be referred to by other names, including radio network controller, RNC, controller, mobile switching center, or serving GPRS support node.

The scope of this document extends to these and similar wireless communication system components using integrator-summer circuits, as well as to other electronic equipment.

Figure 1A:
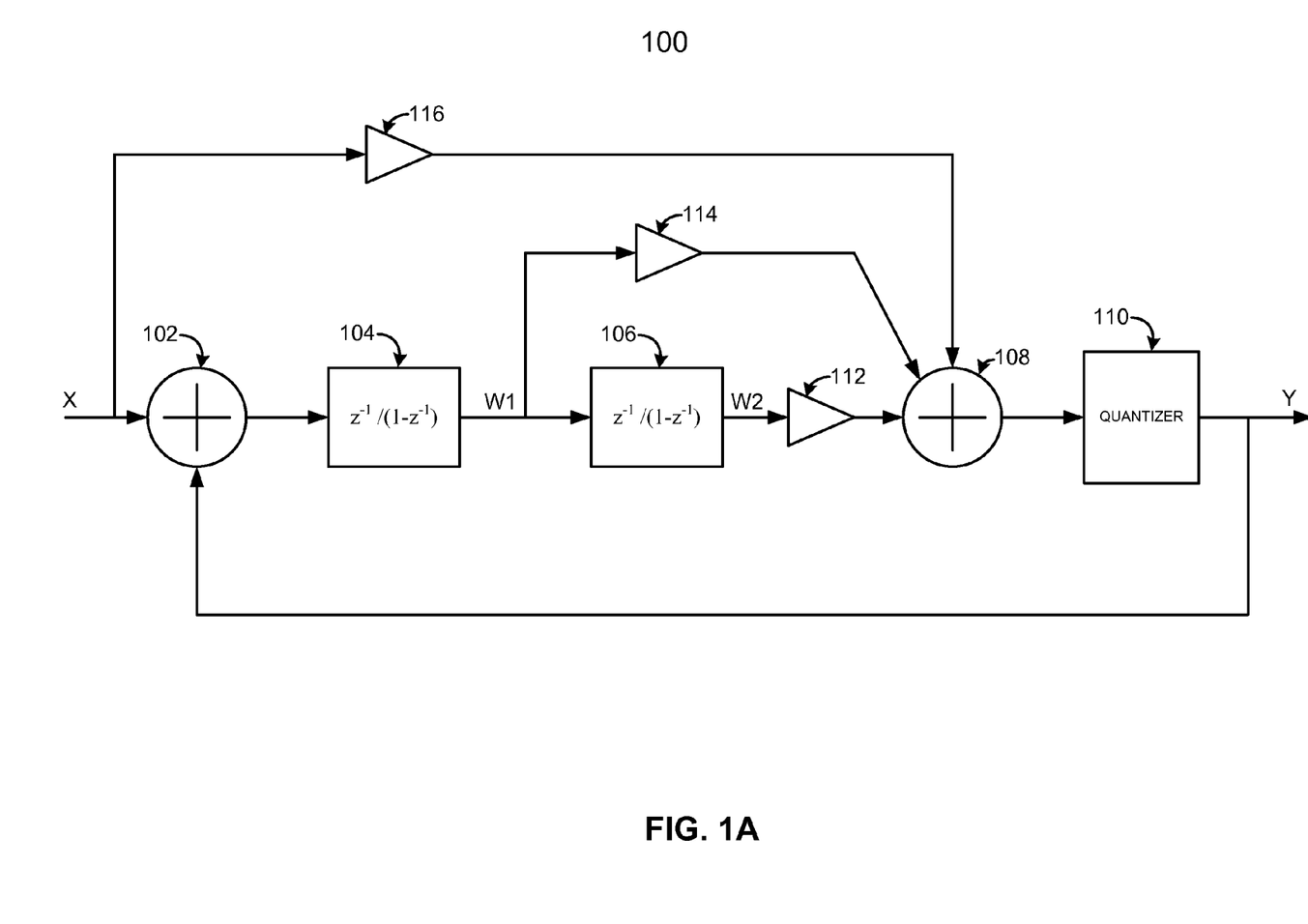
FIG. 1A illustrates selected blocks of an exemplary sigma-delta modulator.

FIG. 1A illustrates selected blocks of a sigma-delta modulator 100. The sigma-delta modulator 100 includes:
  a summer 102;
  an integrator 104;
  an integrator 106;
  a summer 108;
  a quantizer 110;
  an amplifier/buffer 112 between the output of the integrator 106 and an input of the summer 108;
  an amplifier/buffer 114 between the output of the integrator 104 and another input of the summer 108; and
  an amplifier/buffer 116 between the input of the sigma-delta modulator 100 and a third input of the summer 108.

Selected or all of the integrator and summer blocks of the sigma-delta modulator 100 may be implemented using switched capacitor circuits. In switched capacitor circuit designs, charge is moved between different capacitors by switches opened and closed using different clock phases. Typically, the clock phases are non-overlapping, so that some switches are on while others are off, and vice versa. Non-overlapping phases controlling different switches signify "break before make" switch operation of the switches; for example, phase 1 switches are turned off first, then phase 2 switches are turned on, and vice versa.

In operation, the summer 108 generates the output Y by adding the X, W1, and W2 signals, buffered and/or amplified, respectively, by the amplifiers/buffers 112, 114, and 116.

Figure 1B:
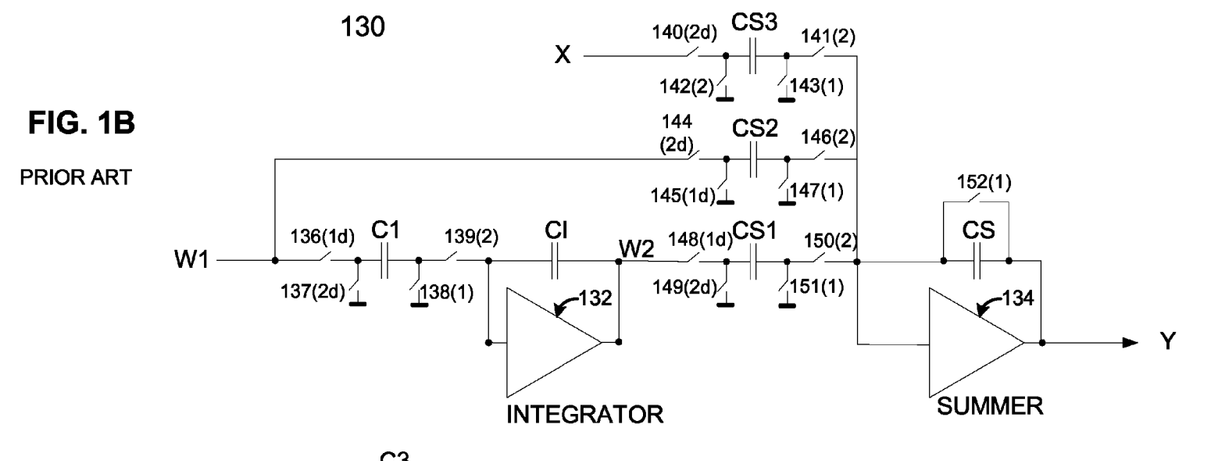
FIG. 1B illustrates selected components of a known switched capacitor circuit 130 of a sigma-delta modulator configured to operate in a single-ended (non-differential) manner.
Figure 1C:
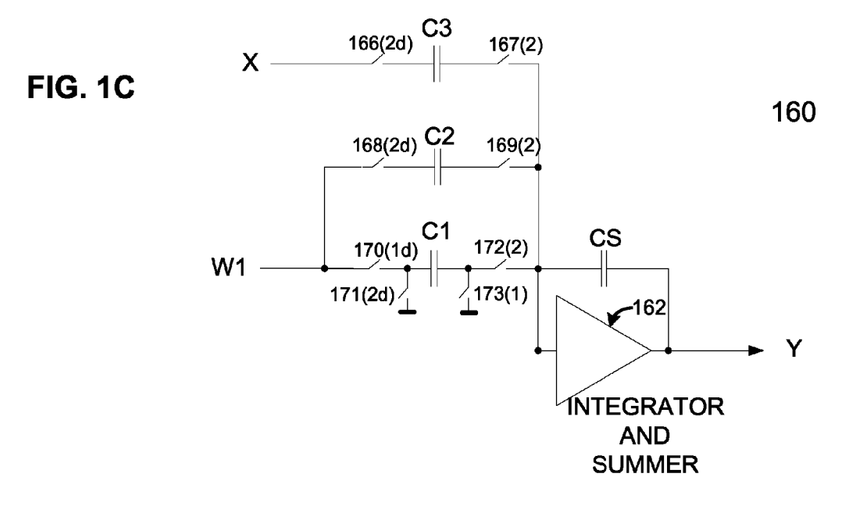
FIG. 1C illustrates selected components of switched capacitor circuit 160 of the current invention of a sigma-delta modulator configured to operate in a single-ended (non-differential) manner.
Figure 4:
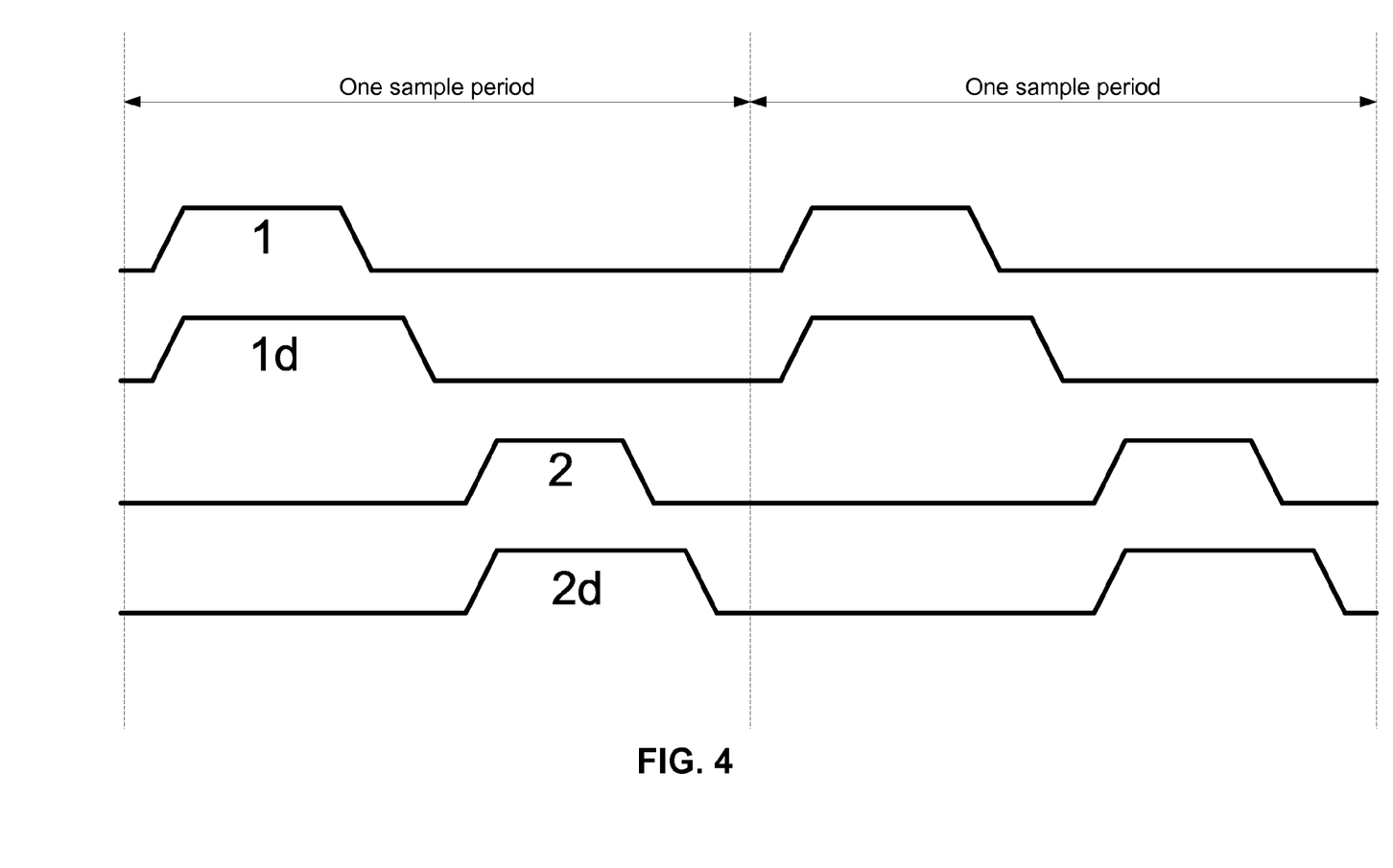
FIG. 4 is a timing diagram illustrating selected aspects of clock signals used to control switches of the switched capacitor circuits of FIGS. 1B, 1C, 2, and 3.

FIG. 1B illustrates selected components of a switched capacitor circuit 130 of a sigma-delta modulator configured to operate in a single-ended (non-differential) manner. The circuit 130 may correspond to the integrator 106, summer 108, buffer 112, and the buffers 114/116 of the sigma-delta modulator 100 of FIG. 1A. This circuit topology uses two operational transconductance amplifiers; the OTA 132 is used for integration, and the OTA 134 is used for summing. Each of the various switches shown in FIG. 1B is operated by one of clock phases 1 or 2, and their variants 1*d* and 2*d*. The designation of the particular clock phase (1, 2) or a phase variant (1*d*, 2*d*) controlling each switch is shown in parentheses next to the switch's reference designator. FIG. 4 is a timing diagram illustrating these clock phases and phase variants. Note that the phase variant 1*d* is a version of the phase 1, having the same rising edge but with a slightly delayed trailing (falling) edge. Similarly, the phase variant 2*d* is a version of the phase 2, having the same rising edge but with a slightly delayed trailing edge. In some embodiments, the phase 1 and the phase variant 1*d* are identical, and the phase 2 and the phase variant 2*d* are also identical. Active (high) states of the phases 1/1*d* do not overlap active states of the phases 2/2*d*. When the control signals corresponding to the phases are in a high state, the respective controlled switches are closed, and when the control signals are in a low state, the controlled switches are open. In some embodiments the polarity is reversed. Such clock arrangements are known to those skilled in the art of switched capacitor designs.

Each of the switches shown in FIG. 1B, and in all other Figures described in this document, may be implemented, for example, as a single Complimentary Metal Oxide Semiconductor (CMOS) transistor, or as a parallel combination of PMOS and NMOS transistor pair.

FIG. 1C illustrates selected components of another switched capacitor circuit 160 of a sigma-delta modulator configured to operate in a single-ended (non-differential) manner. The circuit 160 may correspond to the integrator 106, summer 108, buffer/amplifier 112, and the buffers/amplifiers 114/116 of the modulator 100 of FIG. 1A. This circuit topology uses a single operational transconductance amplifier 162 configured to perform both integration and summing functions. Each of the various switches shown in FIG. 1C is controlled by one of clock phases 1, 1*d*, 2, and 2*d* of FIG. 4, in the same manner as described above in relation to the circuit 130. The phase (or phase variant) controlling each switch is shown in parentheses next to the switch's reference designator.

The input X is routed to the input of the operational transconductance amplifier 162 through a series switch 166 controlled by the phase 2*d*, a series capacitor C3, and a switch 167 controlled by the phase 2. The input W1 is routed to the input of the operational transconductance amplifier 162 through a series switch 168 controlled by the phase 2*d*, a series capacitor C2, and a switch 169 controlled by the phase 2. These two branches (including C3 and C2, respectively) may be referred to as summing input branches. The input W1 is also routed to the input of the operational transconductance amplifier 162 through a series switch 170 controlled by the phase 1*d*, a series capacitor C1, and a series switch 172 controlled by the phase 2. A switch 171 controlled by the phase 2*d* connects the terminal of the capacitor C1 near the switch 170 to the ground (or to another common mode voltage of the circuit 160). Another switch 173, controlled by the phase 1, connects the second terminal of the capacitor C1 to the ground (or to another common mode voltage of the circuit 160). This branch (including the capacitor C1) may be referred to as an integrator input branch. The operational transconductance amplifier output is routed back to the operational transconductance amplifier input through a capacitor CS. The feedback provided by the capacitor CS is negative.

During the first half of a sample period the control signals corresponding to the phases 1 and 1*d* are high, and the control signals for switches 2 and 2*d* are low. Thus during the first half of the sample period the switches 170 and 173 are closed, while the switches 166, 167, 168, 169, 171, and 172 are open. During this time, the capacitor C1 is charged, relative to ground, by the signal at the input W1. After the capacitor C1 is charged, the switch 170 is opened. After the switch 170 is opened and before switches controlled by the phases 2 and 2*d* are closed, C1 is charged to the input voltage W1 and disconnected from the rest of the circuit 160. When the switches controlled by the phases 2 and 2*d* are closed, the charge from C1 flows into the input of the operational transconductance amplifier 162, which input may be a virtual ground because of the negative feedback provided by the capacitor CS. At the same time, the signals X and W1 flow directly into the input of the operational transconductance amplifier 162 through the two summing input branches. The capacitor CS is charged by all three currents flowing through the integrator and summing input branches. In this way the Y signal at the output of the operational transconductance amplifier 162 is a sum of (1) a product of the W1 signal, (2) a product of the X signal, and (3) a product of the integrated W1 signal. Note that "product" in this document means "same as," "amplified," or "attenuated"; in other words, product of a particular signal may be that signal weighted by a constant coefficient;

In comparison to the circuit 130, the use of a single OTA in the circuit 162 may advantageously result in power consumption reduction, smaller size, lower weight, lower fabrication cost, and/or one fewer internal signal node.

Figure 2:
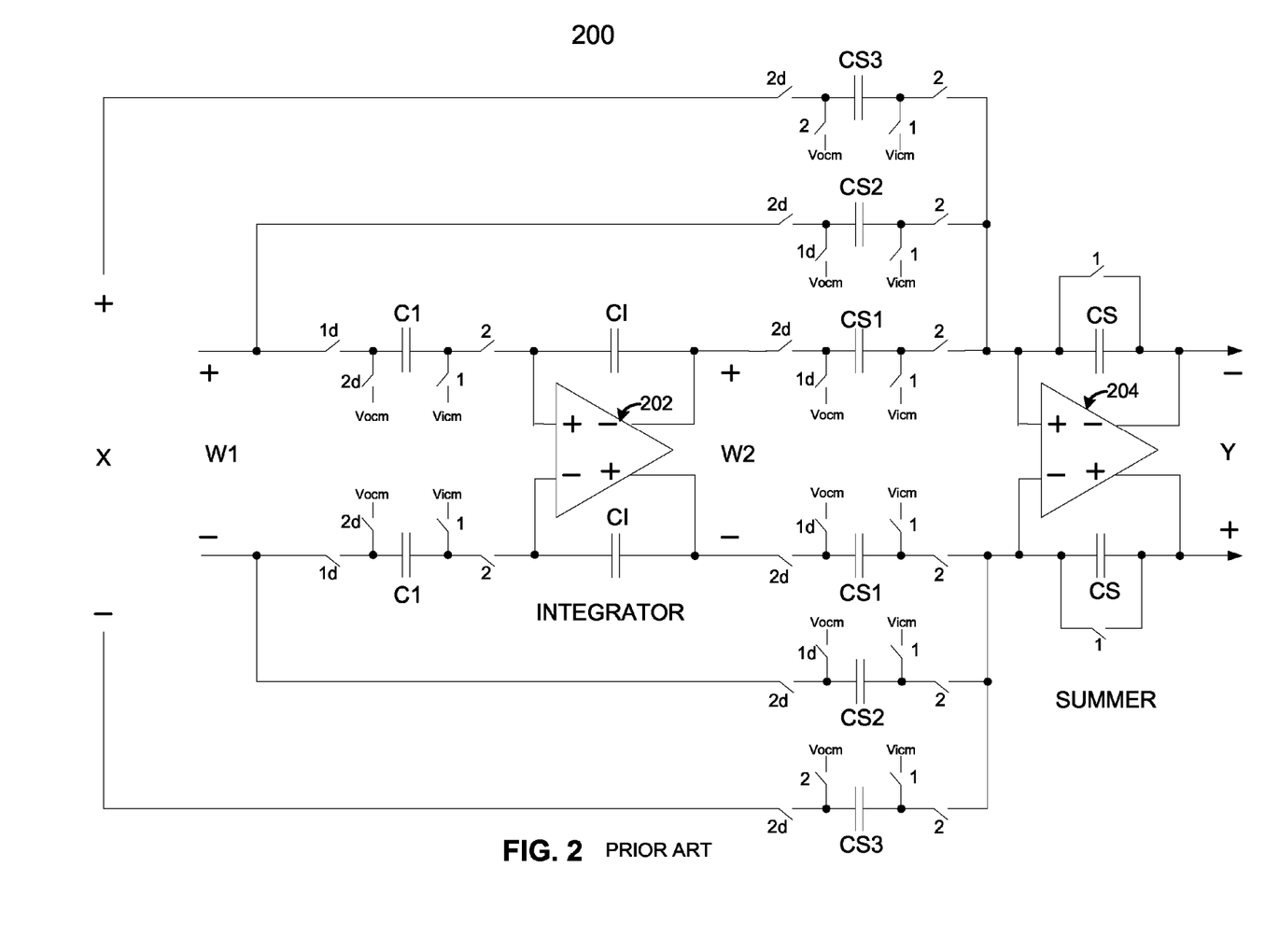
FIG. 2 illustrates selected components of a known switched capacitor circuit 200 of a sigma-delta modulator with two OTAs, the OTA 202 providing the integration function and the OTA 204 providing the summing function.

FIG. 2 illustrates selected components of a switched capacitor circuit 200 of a sigma-delta modulator with two OTAs, the OTA 202 providing the integration function and the OTA 204 providing the summing function. The circuit 200 is similar to the circuit 130, but is configured for operation in a differential mode rather than in a single-ended mode. As in the case of the circuit 130, the circuit 200 may correspond to the integrator 106, summer 108, buffer/amplifier 112, and buffers/amplifiers 114/116 of the modulator 100 of FIG. 1A. Each of the various switches shown in FIG. 2 may be operated by one of the clock phases 1, 1*d*, 2, and 2*d*, in the same manner as is described above in relation to FIGS. 1B and 1C. The designation of the particular clock phase or phase variant (1, 1*d*, 2, 2*d*) controlling each switch is shown next to the switch. Note the presence of two common mode voltages: the input stage common mode voltage Vicm, and the output stage common mode voltage Vocm. Vicm may be the input common mode voltage of the amplifiers, and Vocm may be the output common mode voltage of the amplifiers, which is also assumed to be the common mode of the input signal. These common mode voltages may be the same, or they may be different.

FIG. 3 illustrates selected components of another switched capacitor circuit 300 of a sigma-delta modulator operating in a differential configuration. The components shown in FIG. 3 may correspond to the integrator 106, summer 108, buffer/amplifier 112, and buffers/amplifiers 114/116 of the modulator 100 of FIG. 1A. This circuit topology uses a single differential operational transconductance amplifier 302 configured to perform both integration and summing functions. Each of the various switches shown in FIG. 3 is controlled by one of clock phases or phase variants 1, 1*d*, 2, and 2*d* of FIG. 4, in the same manner as is described above in relation to the circuits 130, 160, and 200. The phase controlling each switch is shown in parentheses next to the switch's reference designator.

In this differential embodiment 300, the signal at the inputs X is routed to the inputs of the OTA 302 via a first summing branch (switch 322, capacitor C3*a*, and switch 323, connected in series, in the order given) and a second summing branch (switch 336, capacitor C3b, and switch 337, connected in series, in the order given). The signal at the inputs W1 is routed to the inputs of the OTA 302 via a third summing branch (switch 328, capacitor C2a, and switch 329, connected in series, in the order given) and a fourth summing branch (switch 330, capacitor C2b, and switch 331, connected in series, in the order given).

The signal at the inputs W1 is also routed to the inputs of the OTA 302 via a first integrator branch (switches 324-327 and capacitor C1a) and a second integrator branch (switches 332-335 and capacitor C1b). In the first integrator branch, the switch 324, capacitor C1a, and switch 325 are coupled in series, in order; the switch 326 connects the junction between one terminal of the capacitor C1a and the switch 324 to a source common mode supply voltage Vscm; and the switch 327 connects the junction between the second terminal of the capacitor C1a and the switch 325 to an input common mode voltage supply Vicm. Vicm may be the input common mode voltage of the amplifier, and Vscm may be the output common mode voltage input signal. The common mode supply voltages Vscm and Vicm may be the same, or they may differ.

In the second integrator branch, the switch 334, capacitor C1b, and switch 335 are coupled in series, in order; the switch 332 connects the junction between one terminal of the capacitor C1b and the switch 334 to the source common mode supply voltage Vscm; and the switch 333 connects the junction between the second terminal of the capacitor C1b and the switch 335 to the input common mode voltage supply Vicm.

The differential outputs of the OTA 302 are routed back to the differential inputs of the OTA 302 through feedback capacitors CS1 and CS2 in a negative feedback configuration, as shown in FIG. 3.

During the first half of a sample period, control signals with phases 1 and 1d are both high and the control signals with phases 2 and 2d are both low. Thus during the first half of the sample period the switches controlled by the phases 1 and 1d are closed, and the switches controlled by the phases 2 and 2d are open. (Polarity may be the opposite in some embodiments.) During this first half of the sample period the capacitors C1a and C1b are charged relative to Vicm by the signals at the W1 inputs. After the capacitors C1a and C1b are charged in the first half of the sample period, the switches 324, 327, 333, and 334 are opened. At this point in time, the capacitors C1a and C1b are in a charged state and disconnected from the rest of the circuit. When the switches 325, 326, 332, and 335 are closed in the second half of the sample period, the charge from the capacitor C1a flows into the positive differential input of the OTA 302 with a potential relative to the Vscm. Likewise, the charge from the capacitor C1b flows into the negative differential input of the OTA 301 with a potential relative to the Vscm. At the same time, the signals at the positive side of W1 and the positive side of X flow into the negative differential input of the OTA 302 through the capacitors C2b and C3b, respectively. Similarly, the signals from the negative side of W1 and negative side of X flow into the positive differential input of the OTA 302 through the capacitors C2a and C3a, respectively. In this way, the OTA 302 provides both integration and summing functions, so that the Y signal at the differential outputs of the operational transconductance amplifier 302 is a sum of (1) a product of the W1 signal, (2) a product of the X signal, and (3) a product of the integrated W1 signal. As before, "product" here means "same as," "amplified," or "attenuated."

Note that the capacitors C1a and C1b are charged relative to the Vicm to ensure that the input signals are correctly sampled relative to the common mode voltage of the input stage; the capacitors C1a and C1b are then discharged relative to Vscm to ensure that the sample signal is correctly applied relative to the common mode voltage of the present stage. As has already been mentioned, Vscm and Vicm may be the same or they may differ from each other.

Note that the capacitors C1a and C1b are charged relative to the Vicm to ensure that the differential voltage across C1a in series with C1b is correct and the amplifier input common mode voltage is equal to Vicm; the capacitors C1a and C1b are then discharged relative to Vscm to ensure that the common mode voltage at the input of the amplifier is the same and equal to Vicm in both clock phases. As has already been mentioned, Vscm and Vicm may be the same or they may differ from each other.

The circuits shown in FIGS. 1A, 1B, 1C, 2, and 3 may include clock generator(s) configured to generate the different clock phases and phase variants needed to operate the switches of those circuits.

Figure 5:
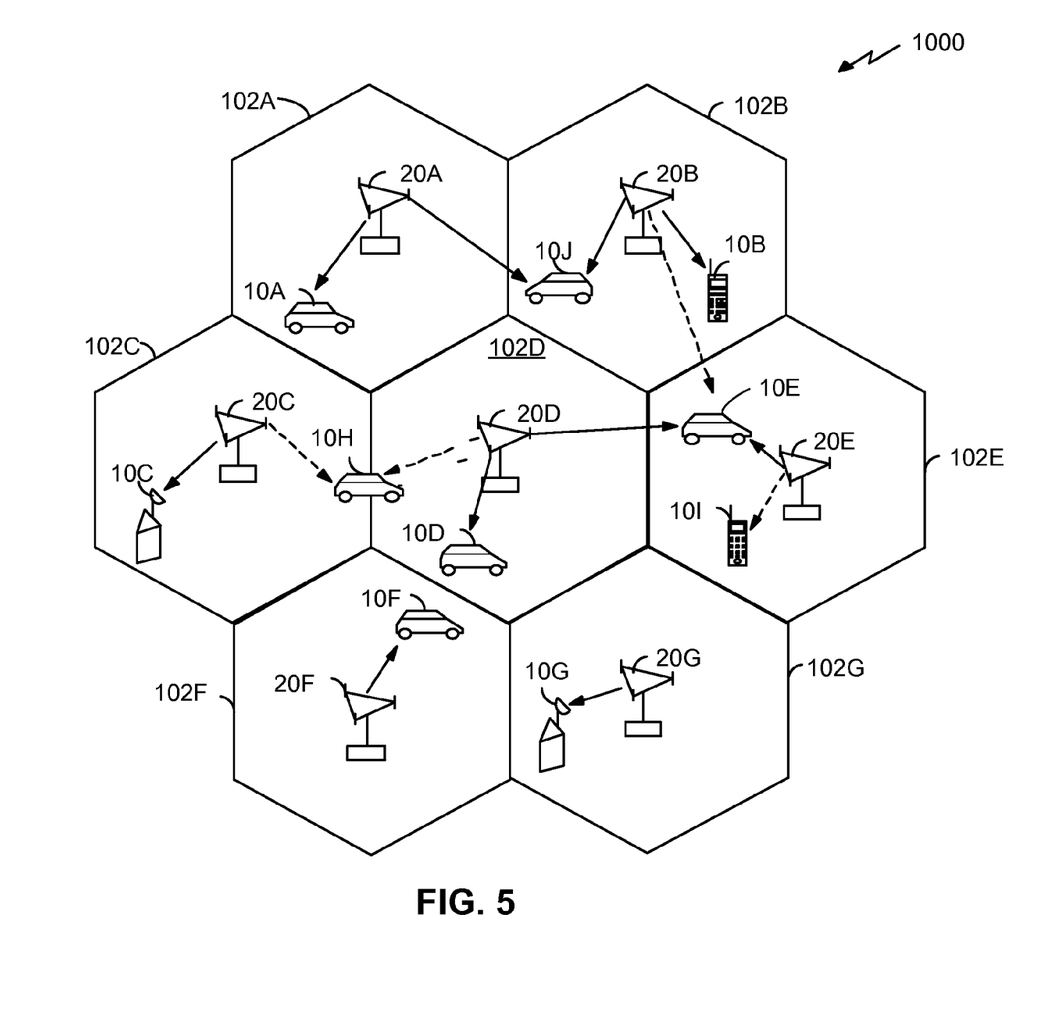
FIG. 5 shows selected elements of a wireless communication system including a radio access network with a plurality of cells/sectors, a plurality of access terminals, and a plurality of base transceiver stations.

FIG. 5 shows selected elements of a wireless communication system 1000 with a plurality of cells and/or sectors 102A-102G of a radio access network, a plurality of access terminals 10A-10J, and a plurality of base transceiver stations 20A-20G (e.g., Node Bs or eNode Bs). The communication system 1000 may use a single carrier frequency or multiple carrier frequencies. Moreover, some of the cells/sectors 102 may use a single carrier frequency, while each of the other cells/sectors 102 may use a plurality of carrier frequencies. Still further, the different links (both forward and reverse) in the cells/sectors 102 may use different numbers of carrier frequencies.

The access network may transport voice and/or data packets between multiple access terminals 10. The access network may be further connected to additional networks outside the access network of the system 100, such as a corporate intranet or the Internet, and may transport the data packets between the access terminals 10 and such outside networks.

The sigma-delta modulators and integrator-summer combinations described in this document may be used in the access terminals 10, base transceiver stations 20, and in other components of the radio access network shown in FIG. 5.

Although steps and decisions of various methods may be described serially in this disclosure, some of these steps and decisions may be performed by separate elements in conjunction or in parallel, asynchronously or synchronously, in a pipelined manner, or otherwise. There is no particular requirement that the steps and decisions be performed in the same order in which this description lists them, except where explicitly so indicated, otherwise made clear from the context, or inherently required. It should be noted, however, that in selected variants the steps and decisions are performed in the particular sequences described and/or shown in the accompanying Figures. Furthermore, not every illustrated step and decision may be required in every embodiment or variant, while some steps and decisions that have not been specifically illustrated may be desirable in some embodiments/variants.

Those of skill in the art would also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the embodiments disclosed herein may be implemented as electronic hardware, computer software, or combinations of both. To show clearly this interchangeability of hardware and software, various illustrative components, blocks, modules, circuits, and steps may have been described above generally in terms of their functionality. Whether such functionality is implemented as hardware, software, or combination of hardware and software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm that may have been described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in an access terminal. Alternatively, the processor and the storage medium may reside as discrete components in an access terminal.

The previous description of the disclosed embodiments is provided to enable any person skilled in the art to make and use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein, but is to be accorded the widest scope consistent with the principles and novel features disclosed herein.

What is claimed is:

1. A switched capacitor circuit comprising:
   a pair of differential first circuit inputs configured to receive a first signal, the pair of differential first circuit inputs comprising a first positive circuit input and a first negative circuit input;
   a pair of differential second circuit inputs configured to receive a second signal, the pair of differential second circuit inputs comprising a second positive circuit input and a second negative circuit input;
   an operational amplifier (OA) comprising a pair of differential OA inputs and a pair of differential OA outputs, the pair of differential OA inputs comprising a positive OA input and a negative OA input, the pair of differential OA outputs comprising a positive OA output and a negative OA output;
   a first integration capacitor coupled between the positive OA input and the negative OA output;
   a second integration capacitor coupled between the negative OA input and the positive OA output;
   a first integration branch coupled between the first positive circuit input and the positive OA input, wherein the first integration branch comprises a first integration capacitor comprising a first terminal of the first integration capacitor and a second terminal of the first integration capacitor, a first switch coupled between the first positive circuit input and the first terminal of the first integration capacitor, a second switch coupled between the first terminal of the first integration capacitor and a first common mode voltage, a third switch coupled between the second terminal of the first integration capacitor and a second common mode voltage, and a fourth switch coupled between the second terminal of the first integration capacitor and the positive OA input;
   a second integration branch coupled between the first negative circuit input and the negative OA input;
   a first summing branch coupled between the first negative circuit input and the positive OA input;
   a second summing branch coupled between the first positive circuit input and the negative OA input;
   a third summing branch coupled between the second negative circuit input and the positive OA input; and
   a fourth summing branch coupled between the second positive circuit input and the negative OA input;
   wherein the first integration branch, the second integration branch, the first summing branch, the second summing branch, the third summing branch, and the fourth summing branch are configured using switched capacitor technique so that the pair of differential OA outputs provides an output signal that is a sum of (1) a product of the first signal, (2) a product of the second signal, and (3) a product of an integral of the first signal.

2. The switched capacitor circuit of claim 1, wherein:
   the second integration branch comprises a second integration capacitor comprising a first terminal of the second integration capacitor and a second terminal of the second integration capacitor, a fifth switch coupled between the first negative circuit input and the first terminal of the second integration capacitor, a sixth switch coupled between the first terminal of the second integration capacitor and the first common mode voltage, a seventh switch coupled between the second terminal of the second integration capacitor and the second common mode voltage, and an eighth switch coupled between the second terminal of the second integration capacitor and the negative OA input.

3. The switched capacitor circuit of claim 2, wherein:
   the first summing branch comprises a first summing capacitor comprising a first terminal of the first summing capacitor and a second terminal of the first summing capacitor, a ninth switch coupled between the first negative circuit input and the first terminal of the first summing capacitor, and a tenth switch coupled between the second terminal of the first summing capacitor and the positive OA input;
   the second summing branch comprises a second summing capacitor comprising a first terminal of the second summing capacitor and a second terminal of the second summing capacitor, an eleventh switch coupled between the first positive circuit input and the first terminal of the second summing capacitor, and a twelfth switch coupled between the second terminal of the second summing capacitor and the negative OA input;

the third summing branch comprises a third summing capacitor comprising a first terminal of the third summing capacitor and a second terminal of the third summing capacitor, a thirteenth switch coupled between the second negative circuit input and the first terminal of the third summing capacitor, and a fourteenth switch coupled between the second terminal of the third summing capacitor and the positive OA input; and the fourth summing branch comprises a fourth summing capacitor comprising a first terminal of the fourth summing capacitor and a second terminal of the fourth summing capacitor, a fifteenth switch coupled between the second positive circuit input and the first terminal of the fourth summing capacitor, and a sixteenth switch coupled between the second terminal of the fourth summing capacitor and the negative OA input.

4. The switched capacitor circuit of claim 3, wherein:
states of the third and seventh switches are controlled by a first clock phase;
states of the first and fifth switches are controlled by a variant of the first clock phase, the variant of the first clock phase having a delayed falling edge relative to the first clock phase;
states of the fourth, eighth, tenth, twelfth, fourteenth, and sixteenth switches are controlled by a second clock phase;
states of the second, sixth, ninth, eleventh, thirteenth, and fifteenth switches are controlled by a variant of the second clock phase, the variant of the second clock phase having a delayed falling edge relative to the second clock phase; and
the first and the second clock phases are coherent and substantially non-overlapping, so that the states of the second, fourth, sixth, and eighth through sixteenth switches are conducting when the states of the first, third, fifth, and seventh switches are non-conducting, and the states of the first, third, fifth, and seventh switches are conducting when the states of the second, fourth, sixth, and eighth through sixteenth switches are non-conducting.

5. The switched capacitor circuit of claim 4, further comprising a clock generator configured to generate the first clock phase, the second clock phase, the variant of the first clock phase, and the variant of the second clock phase.

6. The switched capacitor circuit of claim 3, wherein:
states of the first, third, fifth, and seventh switches are controlled by a first clock phase;
states of the second, fourth, sixth, eighth, ninth, tenth, eleventh, twelfth, thirteenth, fourteenth, fifteenth, and sixteenth switches are controlled by a second clock phase; and
the first and the second clock phases are coherent and substantially non-overlapping, so that the states of the second, fourth, sixth, and eighth through sixteenth switches are conducting when the states of the first, third, fifth, and seventh switches are non-conducting, and the states of the first, third, fifth, and seventh switches are conducting when the states of the second, fourth, sixth, and eighth through sixteenth switches are non-conducting.

7. The switched capacitor circuit of claim 6, further comprising a clock generator configured to generate the first clock phase and the second clock phase.

8. The switched capacitor circuit of claim 6, wherein each switch of the first through sixteenth switches comprises a single Complimentary Metal Oxide Semiconductor (CMOS) transistor.

9. The switched capacitor circuit of claim 6, wherein each switch of the first through sixteenth switches comprises a complimentary N-channel/P-channel Metal Oxide Semiconductor (NMOS/PMOS) transistor pair.

10. A sigma-delta modulator comprising the switched capacitor circuit of claim 3.

11. A method of processing signals in a switched capacitor circuit, the method comprising:
providing a first input signal to an input of an operational amplifier (OA) through at least one integration branch, the input of the OA comprising a positive OA input and a negative OA input, the OA further comprising an output, the output comprising a positive OA output and a negative OA output, the at least one integration branch comprising a first integration branch that comprises a first integration capacitor comprising a first terminal of the first integration capacitor and a second terminal of the first integration capacitor, a first switch coupled between a circuit input that receives the first input signal and the first terminal of the first integration capacitor, a second switch coupled between the first terminal of the first integration capacitor and a first common mode voltage, a third switch coupled between the second terminal of the first integration capacitor and a second common mode voltage, and a fourth switch coupled between the second terminal of the first integration capacitor and the positive OA input;
providing the first input signal to the input of the OA through at least one first summing branch;
providing a second input signal to the input of the OA through at least one second summing branch;
providing negative feedback from the output of the OA to the input of the OA through at least one feedback capacitor; and
providing at least two clock phases to switches of the at least one integration branch, the at least one first summing branch, and the at least one second summing branch, so that the OA outputs a sum of (1) a product of the first signal, (2) a product of the second signal, and (3) a product of an integral of the first signal, wherein:
the at least one first summing branch comprises a second capacitor comprising a first terminal of the second capacitor and a second terminal of the second capacitor, a fifth switch coupled between the first circuit input and the first terminal of the second capacitor, and a sixth switch coupled between the second terminal of the second capacitor and the input of the OA; and
the at least one second summing branch comprises a third capacitor comprising a first terminal of the third capacitor and a second terminal of the third capacitor, a seventh switch coupled between the second circuit input and the first terminal of the third capacitor, and an eighth switch coupled between the second terminal of the third capacitor and the input of the OA.

12. The method of claim 11, wherein:
providing at least two clock phases comprises providing a first clock phase to the third switch, providing a variant of the first clock phase to the first switch, the variant of the first clock phase having a delayed falling edge relative to the first clock phase, providing a second clock phase to the fourth, sixth, and eighth switches, and providing a variant of the second clock phase to the second, fifth, and seventh switches, the variant of the second clock phase having a delayed falling edge relative to the second clock phase; and the first and the second clock phases are coherent and substantially non-overlapping, so that the states of the second, fourth, fifth, sixth, seventh, and eighth switches are conducting when the states of the first and third switches are non-conducting, and the states of the first and third switches are conducting when the states of the second, fourth, fifth, sixth, seventh, and eighth switches are non-conducting.

13. The method of claim 11, wherein:

providing at least two clock phases comprises providing a first clock phase to the first and third switches, and providing a second clock phase to the second, fourth, fifth, sixth, seventh, and eighth switches; and the first and the second clock phases are coherent and substantially non-overlapping, so that the states of the second, fourth, fifth, sixth, seventh, and eighth switches are conducting when the states of the first and third switches are non-conducting, and the states of the first and third switches are conducting when the states of the second, fourth, fifth, sixth, seventh, and eighth switches are non-conducting.

14. A method of processing signals in a switched capacitor circuit, the method comprising:

providing a first input signal to an input of an operational amplifier (OA) through at least one integration branch, the input of the OA comprising a positive OA input and a negative OA input, the OA further comprising an output, the output comprising a positive OA output and a negative OA output, the at least one integration branch comprising a first integration branch that comprises a first integration capacitor comprising a first terminal of the first integration capacitor and a second terminal of the first integration capacitor, a first switch coupled between a circuit input that receives the first input signal and the first terminal of the first integration capacitor, a second switch coupled between the first terminal of the first integration capacitor and a first common mode voltage, a third switch coupled between the second terminal of the first integration capacitor and a second common mode voltage, and a fourth switch coupled between the second terminal of the first integration capacitor and the positive OA input;

providing the first input signal to the input of the OA through at least one first summing branch;

providing a second input signal to the input of the OA through at least one second summing branch;

providing negative feedback from the output of the OA to the input of the OA through at least one feedback capacitor; and providing at least two clock phases to switches of the at least one integration branch the at least one first summing branch, and the at least one second summing branch, so that the OA outputs a sum of (1) a product of the first signal, (2) a product of the second signal, and (3) a product of an integral of the first signal, wherein:

the first input signal is a differential signal;

the second input signal is a differential signal;

the at least one integration branch comprises two integration branches;

the at least one first summing branch comprises two first summing branches; and the at least one second summing branch comprises two second summing branches.

* * * * *